(12) United States Patent
Yazawa et al.

(10) Patent No.: US 11,140,781 B2
(45) Date of Patent: Oct. 5, 2021

(54) ELECTRONIC DEVICE

(71) Applicant: TDK CORPORATION, Tokyo (JP)

(72) Inventors: Kosuke Yazawa, Tokyo (JP); Norihisa Ando, Tokyo (JP); Shinya Ito, Tokyo (JP); Akihiro Masuda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 40 days.

(21) Appl. No.: 16/659,621

(22) Filed: Oct. 22, 2019

(65) Prior Publication Data
US 2020/0128674 A1  Apr. 23, 2020

(30) Foreign Application Priority Data
Oct. 22, 2018 (JP) .............................. JP2018-198753

(51) Int. Cl.
*H01G 4/224* (2006.01)
*H01G 4/236* (2006.01)
(Continued)

(52) U.S. Cl.
CPC ............. *H05K 1/185* (2013.01); *H01G 4/224* (2013.01); *H01G 4/236* (2013.01);
(Continued)

(58) Field of Classification Search
CPC .......... H01G 2/06; H01G 2/106; H01G 4/224; H01G 4/232; H01G 4/236; H01G 4/30; H01G 4/38; H01G 4/1227; H01G 2/103; H01G 4/12; H05K 1/185; H05K 1/18; H05K 3/301; H05K 5/0047; H05K 5/0091; H05K 5/0239; H05K 5/0247; H05K 5/00; H05K 5/02; H05K 2201/10015
(Continued)

(56) References Cited

U.S. PATENT DOCUMENTS

2005/0133240 A1* 6/2005 Hidaka ................... H01G 2/10
174/527
2013/0308281 A1* 11/2013 Motoori ............... H05K 5/0004
361/746
(Continued)

FOREIGN PATENT DOCUMENTS

JP   H11-102837 A   4/1999

*Primary Examiner* — Timothy J Thompson
*Assistant Examiner* — Guillermo J Egoavil
(74) *Attorney, Agent, or Firm* — Oliff PLC

(57) ABSTRACT

An electronic device includes chip components, a terminal connection body, conductive terminals, and a support member. Each of the chip components has a pair of end surfaces on which terminal electrodes are formed. The terminal connection body connects the terminal electrodes on one side of the chip components arranged next to each other in a parallel direction to the end surfaces. Each of the conductive terminals includes a connection part and a mount part. The connection part is connected with the terminal electrode of either of the chip components located on both ends of the chip components connected in series via the terminal connection body. The mount part faces the connection part and is connected with a mount board. The support member is disposed between the connection parts and the mount parts. The chip components are arranged so that the end surfaces face the mount board.

10 Claims, 8 Drawing Sheets

(51) Int. Cl.
*H05K 1/18* (2006.01)
*H05K 5/00* (2006.01)
*H01G 4/232* (2006.01)
*H01G 4/30* (2006.01)
*H05K 5/02* (2006.01)

(52) U.S. Cl.
CPC ......... *H05K 5/0047* (2013.01); *H05K 5/0091* (2013.01); *H05K 5/0239* (2013.01); *H05K 5/0247* (2013.01)

(58) Field of Classification Search
USPC .............................................. 361/763, 306.1
See application file for complete search history.

(56) References Cited

U.S. PATENT DOCUMENTS

| 2018/0182553 | A1* | 6/2018 | Yazawa | H01G 4/30 |
| 2019/0180943 | A1* | 6/2019 | Togawa | H01L 41/053 |
| 2020/0098521 | A1* | 3/2020 | Ito | H01G 4/38 |

* cited by examiner

ELECTRONIC DEVICE

BACKGROUND OF THE INVENTION

The present invention relates to an electronic device with a metal terminal.

In addition to a normal chip component that is solely directly mounted on a board, as shown in Patent Document 1 for example, a chip component attached with a metallic cap (metal terminal) is known as an electronic device, such as a ceramic capacitor.

It is reported that the electronic device attached with a metal terminal after being mounted has a reduction effect on a deformation stress that travels from a board to a chip component and a protection effect on a chip component from impacts or so. Thus, the electronic device attached with a metal terminal is used in a field where durability, reliability, and the like are required.

Patent Document 1: JPH11102837 (A)

BRIEF SUMMARY OF INVENTION

However, a conventional electronic device as shown in Patent Document 1 has a comparatively large occupation area on a circuit board and is hard to correspond to a high-density mounting of electronic devices in accordance with downsizing of electronic equipment.

The present invention has been achieved under such circumstances. It is an object of the invention to provide an electronic device including a conductive terminal capable of being mounted with a saved space.

To achieve the above object, an electronic device according to the present invention includes:

a plurality of chip components each having a pair of end surfaces on which terminal electrodes are formed;

a terminal connection body connecting the terminal electrodes on one side of the chip components arranged next to each other in a parallel direction to the end surfaces;

a plurality of conductive terminals each including:
 a connection part connected with the terminal electrode of either of the chip components located on both ends of the chip components connected in series via the terminal connection body; and
 a mount part facing the connection part and connected with a mount board; and
a support member with insulation disposed between the connection parts and the mount parts, wherein the chip components are arranged so that the end surfaces face the mount board.

In the electronic device according to the present invention, the chip components are arranged so that the end surfaces face the mount board. Thus, compared to when the chip components are arranged so that the end surfaces are perpendicular to the mount board (see Patent Document 1), an occupation area of the electronic device on a circuit board is reduced, the electronic device can be mounted on the circuit board with a saved space, and a high-density mounting of the electronic device can be achieved.

In the electronic device according to the present invention, the chip components can easily be connected in series via the terminal connection body and the conductive terminals. For example, when the chip components are capacitor chips, the series connection of the capacitor chips can increase the withstand voltage of the capacitor assembly and contribute to the improvement in safety of electronic equipment on which the capacitor assembly is mounted.

In the electronic device according to the present invention, since the support member is disposed between the connection parts and the mount parts, the chip components arranged above the connection parts are stably supported by the support member, an excessive load is prevented from acting to the connection parts, and the shapes of the conductive terminals (particularly, the connection parts) can be maintained.

Preferably, the electronic device according to the present invention further includes a partition member with insulation disposed between the chip components arranged next to each other in a parallel direction to the end surfaces. In this structure, the chip components can be insulated and prevented from having a short-circuit failure.

Preferably, the electronic device according to the present invention further includes an insulation case including a plurality of concave housing parts each having an opening part at one end. In this structure, the chip components can be housed in the housing parts, respectively, and protected from impacts or so.

Preferably, the support member forms a bottom part of the insulation case, and the partition member forms a wall surface (also referred to as a partition part) dividing the housing parts. In this structure, the bottom part of the insulation case can function as the support member, and the partition part of the insulation case can function as the partition member. Thus, when the chip components are housed in the insulation case, effects of both of the support member and the partition member can be obtained at the same time.

Preferably, the electronic device according to the present invention further includes a lid configured to be attached to the insulation case so as to cover the opening parts. The chip components can effectively be protected from impacts or so by attaching the lid to the insulation case. Due to the attachment of the lid to the insulation case, the chip components housed in the housing parts are pressed by the lid against the bottom part (support member) of the insulation case, and the terminal electrodes of the chip components can be connected under pressure with the connection parts of the conductive terminals. Thus, the conductive terminals and the terminal electrodes can be connected reliably.

Preferably, the lid includes the terminal connection body, and the terminal electrodes on one side of the chip components arranged next to each other in a parallel direction to the end surfaces are connected by the terminal connection body in the attachment of the lid to the insulation case. In this structure, the chip components arranged next to each other in a parallel direction to the end surfaces can be connected in series via the terminal connection body only by attaching the lid to the insulation case, and the electronic device with simple structure can be obtained.

DETAILED DESCRIPTION OF INVENTION

Hereinafter, the present invention is described based on embodiments shown in the figures.

First Embodiment

Figure 1:
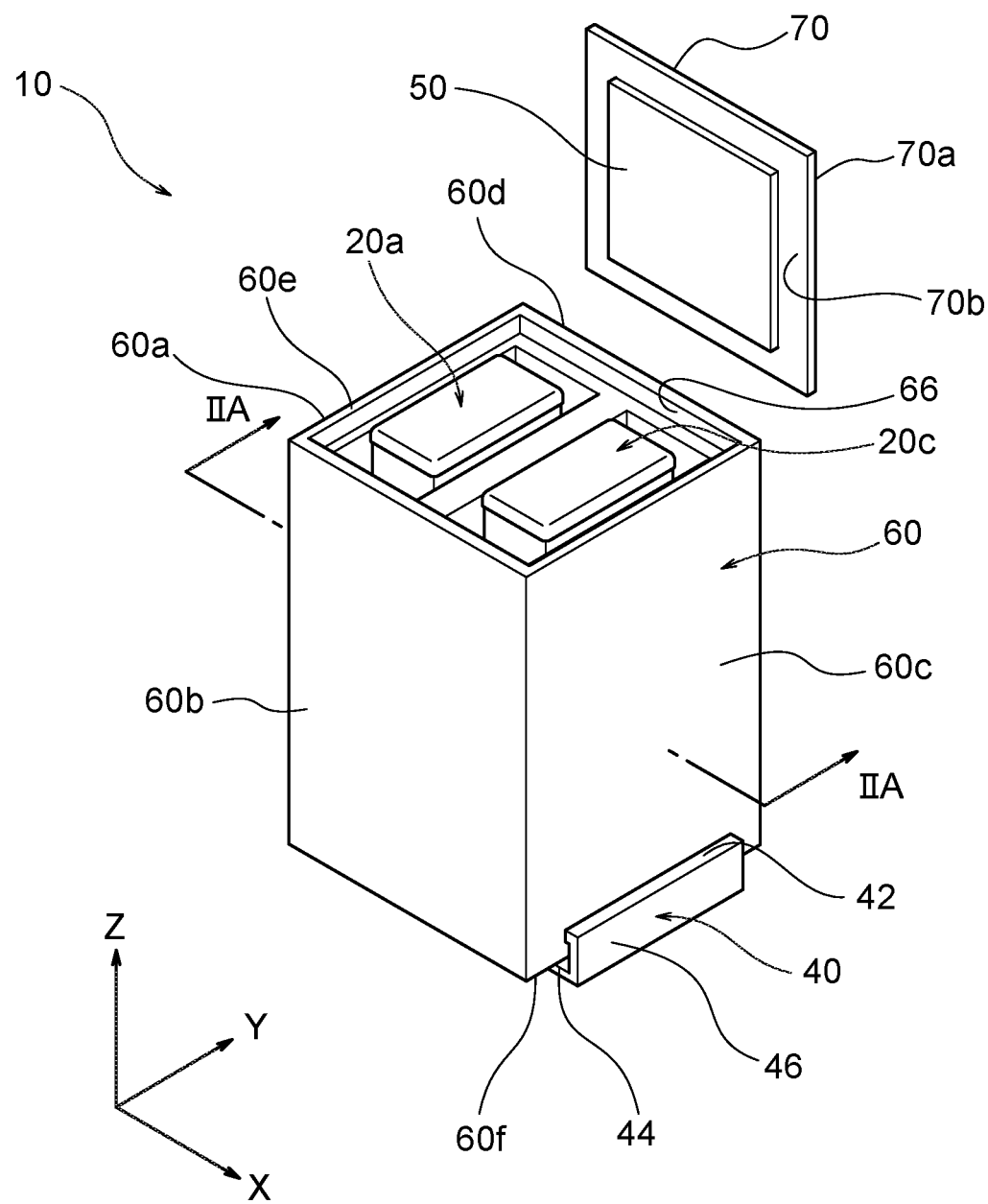
FIG. 1 is a schematic perspective view illustrating a capacitor assembly according to First Embodiment of the present invention.
Figure 2A:
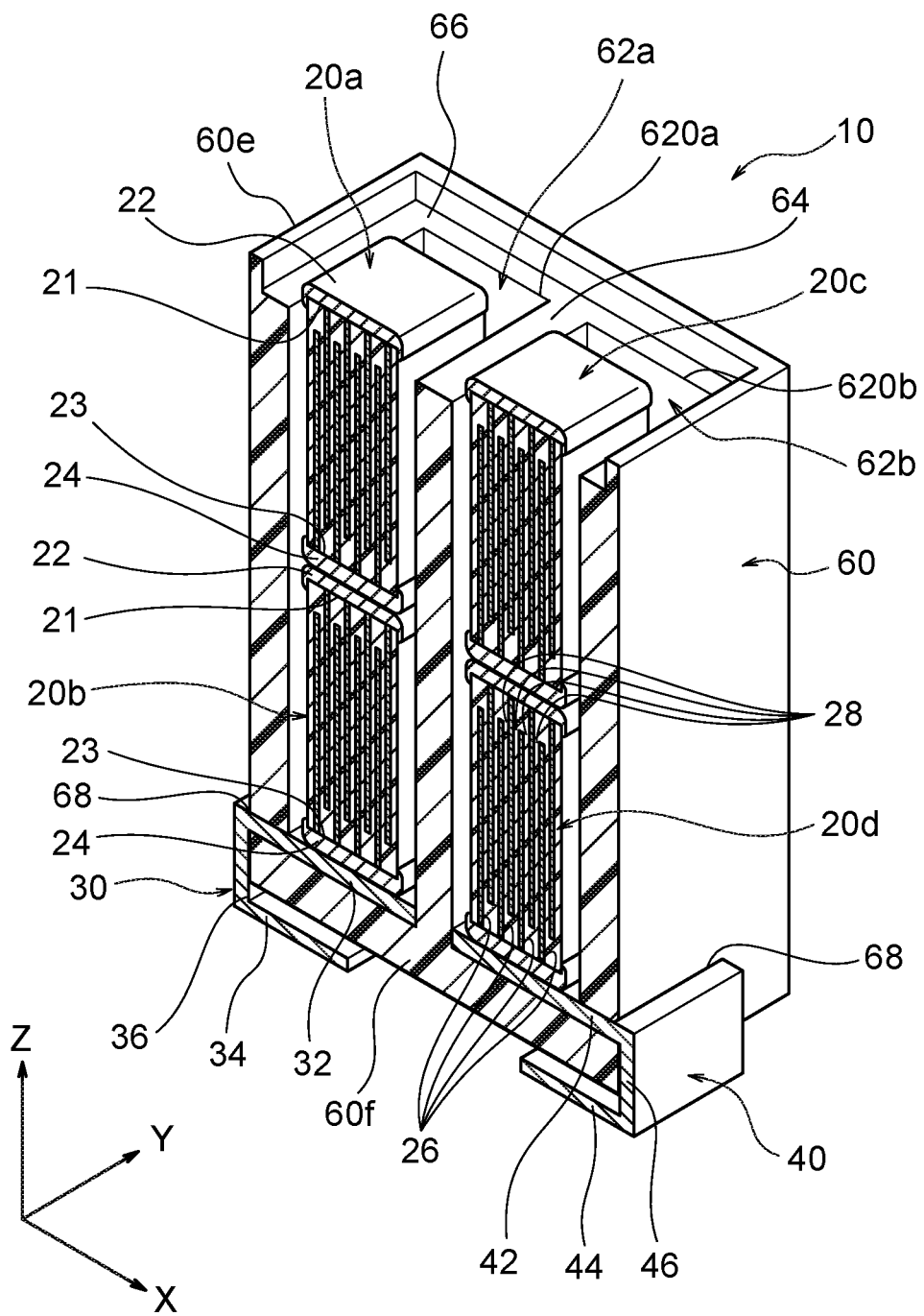
FIG. 2A is a cross-sectional perspective view of the capacitor assembly along the IIA-IIA line shown in FIG. 1.

As shown in FIG. 1 and FIG. 2A, a capacitor assembly 10 as an example of the electronic device according to First Embodiment of the present invention includes four capacitor chips 20a to 20d (chip components), a pair of first and second metal terminals 30 and 40, a terminal connection body 50, an insulation case 60, and a lid 70. Incidentally, the first and second metal terminals 30 and 40 may be formed by a conductive terminal made of a conductive material other than metal.

As shown in FIG. 2A, the capacitor chips 20a to 20d have a substantially rectangular parallelepiped shape and have substantially the same shape and size. Each of the capacitor chips 20a to 20d has a pair of first and second end surfaces 21 and 23 facing each other in the Z-axis direction (longitudinal direction).

The capacitor chips 20a to 20d are arranged so that the end surfaces 21 and 23 face a mount surface, and so that four lateral surfaces positioned between the first end surface 21 and the second end surface 23 are substantially perpendicular to the mount surface. Incidentally, the mount surface of the capacitor assembly 10 corresponds to lower surfaces of mount parts 34 and 44 of metal terminals 30 and 40 mentioned below.

A first terminal electrode 22 is formed at an end of each of the capacitor chips 20a to 20d near the first end surfaces 21. The first end surface 21 is covered with the first terminal electrode 22. The first terminal electrode 22 reaches a part of the four lateral surfaces of each of the capacitor chips 20a to 20d. That is, the first terminal electrode 22 has a part disposed on the first end surface 21 and a part disposed on the four lateral surfaces of each of the capacitor chips 20a to 20d.

A second terminal electrode 24 is formed at an end of each of the capacitor chips 20a to 20d near the second end surface 23. The second end surface 23 is covered with the second terminal electrode 24. The second terminal electrode 24 reaches a part of the four lateral surfaces of each of the capacitor chips 20a to 20d (a different part from the part where the first terminal electrode 22 reaches). That is, the second terminal electrode 24 has a part disposed on the second end surface 23 and a part disposed on the four lateral surfaces of each of the capacitor chips 20a to 20d.

The capacitor chips 20a to 20d are multilayer capacitors where internal electrode layers 26 and dielectric layers 28 are laminated. The internal electrode layers 26 are divided into those connected with the first terminal electrode 22 and those connected with the second terminal electrode 24. The internal electrode layers 26 connected with the first terminal electrode 22 and the internal electrode layers 26 connected with the second terminal electrode 24 are alternately laminated by sandwiching the dielectric layers 28.

The lamination direction of the internal electrode layers 26 of the capacitor chips 20a to 20d are parallel to the X-axis and perpendicular to the Y-axis and the Z-axis. That is, the internal electrode layers 26 are arranged in parallel to the Y-Z plane and perpendicularly to the mount surface.

The dielectric layers 28 of the capacitor chip 20a to 20d are composed of any dielectric material, such as calcium titanate, strontium titanate, barium titanate, and a mixture thereof. Each of the dielectric layers 28 has any thickness, but normally has a thickness of 1 μm to several hundred μm. In the present embodiment, each of the dielectric layers 28 preferably has a thickness of 1.0 to 5.0 μm. The dielectric layers 28 preferably have a main component of barium titanate, which can increase capacitance of capacitors.

The internal electrode layers 26 contain any conductive material, but may contain a comparatively inexpensive base metal when the dielectric layers 28 are composed of a reduction resistant material. The base metal is preferably Ni or a Ni alloy. The Ni alloy is preferably an alloy of Ni and one or more elements of Mn, Cr, Co, and Al, and preferably contains Ni at 95 wt % or more. Incidentally, Ni or the Ni alloy may contain various fine components, such as P, at about 0.1 wt % or less. The internal electrode layers 26 may be formed using a commercially available electrode paste. Each of the internal electrode layers 26 has a thickness appropriately determined based on usage or so.

The terminal electrodes 22 and 24 are also composed of any material. The terminal electrodes 22 and 24 are normally composed of copper, copper alloy, nickel, nickel alloy, or the like, but may be composed of silver, an alloy of silver and palladium, or the like. Each of the terminal electrodes 22 and 24 also has any thickness, but normally has a thickness of about 10 to 50 μm. Incidentally, at least one metal film of Ni, Cu, Sn, etc. may be formed on the surfaces of the terminal electrodes 22 and 24.

Each of the capacitor chips 20a to 20d has shape and size that are appropriately determined based on object and usage. For example, each of the capacitor chips 20a to 20d has a length (a length in the Z-axis shown in FIG. 2A) of 1.0 to 6.5 mm, a width (a length in the Y-axis shown in FIG. 2A) of 0.5 to 5.5 mm, and a thickness (a length in the X-axis shown in FIG. 2A) of 0.3 to 3.5 mm. The capacitor chips 20a to 20d may have mutually different size and shape.

As shown in FIG. 1, the insulation case 60 is formed by a rectangular parallelpiped housing and includes four lateral parts 60a to 60d, a top part 60e, and a bottom part 60f. The insulation case 60 is made of an insulator, such as ceramic, glass, and synthetic resin, and is preferably made of a flame-retardant material. Incidentally, most of the top part 60e forms an opening.

As shown in FIG. 2A, the insulation case 60 includes a first housing part 62a and a second housing part 62b. The housing parts 62a and 62b have a concave shape and are arranged next to each other in the X-axis direction. Opening parts 620a and 620b opening toward the top part 60e of the insulation case 62 are formed at one ends (upper ends) of the housing parts 62a and 62b. The other ends (lower ends) of the housing parts 62a and 62b are the bottom part 60f of the insulation case 60.

The width of the housing part 62a (62b) in the Y-axis direction is slightly larger than the width of each of the capacitor chips 20a to 20d in the Y-axis direction and is large enough to easily put the capacitor chips 20a and 20b and the capacitor chips 20c and 20d into the housing parts 62a and 62b, respectively, via the opening parts 620a and 620b. Thus, the capacitor chips 20a to 20d can be protected from impacts or so by putting the capacitor chips 20a and 20b and the capacitor chips 20c and 20d into the housing parts 62a and 62b.

The capacitor chips 20a and 20b and the capacitor chips 20c and 20d are housed and laminated in the housing parts 62a and 62b. The first and second end surfaces 21 and 23 of the capacitor chips 20a and 20b and the capacitor chips 20c and 20d are arranged to face the mount surface. Hereinafter, a position where the capacitor chips 20a and 20c are arranged is referred to as an upper stage (one side), and a position where the capacitor chips 20b and 20d are arranged is referred to as a lower stage (the other side).

The first terminal electrode 22 of the capacitor chip 20b (20d) disposed on the lower stage and the second terminal electrode 24 of the capacitor chip 20a (20c) disposed on the upper stage are connected directly. The capacitor chip 20a and the capacitor chip 20b are connected in series, and the capacitor chip 20c and the capacitor chip 20d are connected in series. Incidentally, a conductive member may be disposed between the first terminal electrode 22 and the second terminal electrode 24, and via the conductive member, the capacitor chip 20a and the capacitor chip 20b may be connected in series, and the capacitor chip 20c and the capacitor chip 20d may be connected in series.

As described above, since the housing parts 62a and 62b are arranged next to each other in the X-axis direction, when the capacitor chips 20a and 20b and the capacitor chips 20c and 20d are put into the housing parts 62a and 62b, the capacitor chip 20a housed in the housing part 62a and the capacitor chip 20c housed in the housing part 62b are arranged next to each other in the X-axis direction (a parallel direction to the end surfaces 21 and 23). Likewise, the capacitor chip 20b housed in the housing part 62a and the capacitor chip 20d housed in the housing part 62b are arranged next to each other in the X-axis direction (a parallel direction to the end surfaces 21 and 23).

The depth of the housing part 62a (62b) in the Z-axis direction is slightly smaller than an approximate double of a longitudinal length of each of the capacitor chips 20a to 20d. Thus, when the capacitor chips 20a and 20b and the capacitor chips 20c and 20d are put into the housing parts 62a and 62b, the first end surfaces 21 (or the first terminal electrodes 22) of the capacitor chips 20a and 20c positioned on the upper stage are exposed upward from the opening parts 620a and 620b in the Z-axis direction.

Incidentally, the depth of the housing part 62a (62b) in the Z-axis direction may be equal to an approximate double of a longitudinal length of each of the capacitor chips 20a to 20d. In this case, the first terminal electrode 22 of the capacitor chip 20a (20c) disposed on the upper stage is substantially flush with the opening part 620a (620b).

The first housing part 62a and the second housing part 62b are divided by a partition part 64 (partition member) of the insulation case 60. The partition part 64 has parallel surfaces to the lateral parts 60a and 60c of the insulation case 60 shown in FIG. 1 and is disposed between the capacitor chips 20a and 20c and the capacitor chips 20b and 20d arranged next to each other in the X-axis direction (a parallel direction to the end surfaces 21 and 23). The length of the partition part 64 in the Z-axis direction is substantially equal to the depth of the housing part 62a (62b) in the Z-axis direction. Incidentally, the capacitor assembly 10 is formed in a line-symmetrical manner relative to the partition part 64 (symmetry axis).

Since the insulation case 60 includes the partition part 64, the capacitor chips 20a and 20b housed in the housing part 62a and the capacitor chips 20c and 20d housed in the housing part 62b can be insulated and prevented from having a short-circuit failure.

A step 66 is formed on the top part 60e of the insulation case 60. The step 66 is formed inside the upper ends of the lateral parts 60a to 60d of the insulation case 60 (the side where the housing parts 62a and 62b are arranged), and these upper ends have an L inner shape due to the step 66. The height of the step 66 is slightly larger than the thickness of the lid 70.

As shown in FIG. 1, the lid 70 is attached to the insulation case 60 so as to cover the opening parts 620a and 620b shown in FIG. 2A. For more detail, the shape (square) of the outline of the lid 70 corresponds to the shape (square) of the outline of the step 66, and the lid 70 can be engaged with the insulation case 60 by being engaged with the step 66. When the lid 70 is attached to the insulation case 60, the top part 60e of the insulation case 60 and a surface 70a of the lid 70 are substantially flush with each other.

As shown in FIG. 2A, openings 68 each having a substantially rectangular shape being longer in the Y-axis direction are formed below the insulation case 60. The openings 68 are formed on both sides of the insulation case 60 in the X-axis direction. Connection parts 32 and 42 of the metal terminals 30 and 40 mentioned below can be inserted into the openings 68.

As shown in FIG. 1, the lid 70 includes the terminal connection body 50 with a flat plate shape. The terminal connection body 50 is attached on a rear surface 70b of the lid 70 by adhesion or so. The terminal connection body 50 connects the terminal electrodes on one side of the capacitor chips 20a and 20c (20b and 20d) arranged next to each other in the X-axis direction (a parallel direction to the end surfaces 21 and 23).

In the present embodiment, the terminal connection body 50 connects the above-mentioned terminal electrodes at a position facing the metal terminals 30 and 40. That is, the terminal connection body 50 connects the first terminal electrode 22 of the capacitor chip 20a on the upper stage housed in the housing part 62a and the first terminal electrode 22 of the capacitor chip 20c on the upper stage housed in the housing part 62b.

When the lid 70 is attached to the insulation case 60, the first terminal electrodes 22 of the capacitor chips 20a and 20c on the upper stage arranged next to each other in the X-axis direction are mutually connected (communicated) by the terminal connection body 50.

The width of the terminal connection body 50 in the X-axis direction and the width of the terminal connection body 50 in the Y-axis direction are slightly smaller than the width of the lid 70 in the X-axis direction and the width of the lid 70 in the Y-axis direction, respectively, but are not limited as long as the first terminal electrodes 22 of the capacitor chips 20a and 20c can be electrically connected.

As shown in FIG. 2A, the first metal terminal 30 and the second metal terminal 40 have the same structure and are formed by bending a conductive plate (e.g., metal plate) in a substantially C shape. The metal terminals 30 and 40 are arranged so that an opening part of the C shape faces the central part of the insulation case 60 in the X-axis direction. The metal plate has any thickness, but preferably has a thickness of about 0.01 to 2.0 mm.

The metal terminal 30 (40) includes the connection part 32 (42), the mount part 34 (44), and the link part 36 (46), and these are formed integrally. The connection parts 32 and 42 are connected with the terminal electrodes of the capacitor chips located on both ends of the four capacitor chips 20a to 20d connected in series via the single terminal connection body 50.

In the present embodiment, the capacitor chips 20a and 20b housed in the housing part 62a are connected in series, the capacitor chips 20c and 20d housed in the housing part 62b are connected in series, the capacitor chips 20a and 20c arranged on the upper stage in the housing parts 62a and 62b are connected by the terminal connection body 50, and the four capacitor chips 20a to 20d are thereby connected in series.

In this case, the capacitor chips 20b and 20d arranged on the lower stage in the housing parts 62a and 62b correspond to the capacitor chips located on both ends of the four capacitor chips 20a to 20d, and the second terminal electrodes 24 of the capacitor chips 20b and 20d are electrically connected with the connection parts 32 and 42.

As shown in FIG. 1 and FIG. 2A, the connection parts 32 and 42 extend inside the insulation case 60 and go through the lateral parts 60a and 60c of the insulation case 60 in the X-axis direction. The length of the connection part 32 (42) in the X-axis direction is equal to an approximate half of the width of the insulation case 60 in the X-axis direction. The connection parts 32 and 42 extend to (reach) the partition part 64 above the bottom part 60f of the insulation case 60. Incidentally, the extending direction of the connection part 32 (42) is the same as the direction connecting the first housing part 62a and the second housing part 62b or as the orthogonal direction to the partition part 64.

The width of the connection part 32 (42) in the Y-axis direction is substantially the same as the width in the Y-axis direction of the second terminal electrode 24 of each of the capacitor chips 20a to 20d, but is not limited as long as the electric connection with the second terminal electrode 24 is secured.

The mount parts 34 and 44 face the connection parts 32 and 42 and a mount board and are connected with the mount board. The lower surfaces of the mount parts 34 and 44 correspond to the mount surface. The mount parts 34 and 44 are arranged outside the insulation case 60 and extend below the bottom part 60f in the X-axis direction along the bottom part 60f of the insulation case 60. Incidentally, the extending direction of the mount part 34 (44) is the same as that of the connection part 32 (42).

The link part 36 (46) links the connection part 32 (42) and the mount part 34 (44). The link part 36 (46) extends substantially perpendicularly to the connection part 32 (42) and the mount part 34 (44). The length of the link part 36 (46) in the Z-axis direction is configured to be slightly larger than the thickness in the Z-axis direction of the bottom part 60f of the insulation case 60.

In the present embodiment, the bottom part 60f of the insulation case 60 is disposed (sandwiched) between the connection part 32 (42) and the mount part 34 (44). The bottom part 60f of the insulation case 60 is attached on the lower surfaces of the connection parts 32 and 42 and can support the connection parts 32 and 42.

Thus, when the second terminal electrodes 24 of the capacitor chips 20b and 20d on the lower stage housed in the housing parts 62a and 62b are connected under pressure with the connection parts 32 and 42, even if a load acting downward in the Z-axis direction applies to the connection parts 32 and 42, the connection parts 32 and 42 can be supported on the bottom part 60f of the insulation case 60, and the shapes of the connection parts 32 and 42 can be maintained. Thus, the bottom part 60f of the insulation case 60 functions as a support member (holding member).

In the illustrated example, the bottom part 60f of the insulation case 60 and the connection parts 32 and 42 of the metal terminals 30 and 40 are contacted (attached), but a predetermined space may be formed between the bottom part 60f of the insulation case 60 and the connection part 32 (42) of the metal terminal 30 (40). In this case, when the connection parts 32 and 42 are pressed by the capacitor chips 20b and 20d on the lower stage housed in the housing parts 62a and 62b, the connection parts 32 and 42 are bent (deformed) downward in the Z-axis direction. The width in the Z-axis direction of the housing space of the housing part 62a (62b) can be variable by the bent amount, and the errors of size or so of the capacitor chips 20a to 20d can be absorbed. Moreover, due to the spring force (elasticity), the connection parts 32 and 42 can effectively be connected under pressure with the second terminal electrodes 24 of the capacitor chips 20b and 20d, and the capacitor chips 20b and 20d and the metal terminals 30 and 40 can securely and firmly be connected.

Hereinafter, a method of manufacturing the capacitor assembly 10 is explained.

In the manufacture of the multilayer capacitor chips 20 to 20d, a capacitor element body is initially obtained by pressurizing and firing a laminated body prepared by laminating green sheets (to be the dielectric layers 28 after firing) with electrode patterns to be the internal electrode layers 26 after firing. Moreover, the first and second terminal electrodes 22 and 24 are formed on the capacitor element body by baking and plating a terminal electrode paint, and the capacitor chips 20a to 20d are thereby obtained.

A paint for green sheets and a paint for internal electrode layers (raw materials of the laminated body), a raw material of the terminal electrodes, firing conditions of the laminated body and the electrodes, and the like are not limited and can be determined with reference to known methods or so. In the present embodiment, ceramic green sheets whose main component is barium titanate are used as a dielectric material. In the terminal electrodes, a Cu paste is immersed and baked to form a baked layer, a Ni plating treatment and a Sn plating treatment are conducted, and Cu baked layer/Ni plating layer/Sn plating layer is thereby formed.

In the manufacture of the first metal terminal 30, a flat metal plate is initially prepared. The metal plate is composed of any conductive metal material, such as iron, nickel, copper, silver, and an alloy thereof. Next, the metal plate is machined into intermediate members provided with shapes of the connection part 32, the mount part 34, and the link part 36.

Next, a metal film is formed by plating on the surfaces of the intermediate members formed by the machining, and the first metal terminal 30 is thereby obtained. Any material, such as Ni, Sn, and Cu, is used for the plating. Incidentally, a plurality of first metal terminals 30 may be formed in a mutually connected state from a metal plate continuing in a band manner. The plurality of first metal terminals 30 connected with each other is cut into pieces before or after being connected with the capacitor chips 20a to 20d. The second metal terminal 40 is manufactured in a similar manner to the first metal terminal 30.

In a method of manufacturing the terminal connection body 50, an intermediate member provided with the shape of the terminal connection body 50 is obtained by machining the above-mentioned metal plate, and a metal film is formed on the intermediate member by plating.

In a method of manufacturing the insulation case 60, the insulation case 60 shown in FIG. 1 and FIG. 2A is obtained by injecting a molten resin into a die corresponding to the shape of the insulation case 60 shown in FIG. 1 and FIG. 2A.

The first and second metal terminals 30 and 40 obtained in the above-mentioned manner are attached to the insulation case 60. The metal terminals 30 and 40 can be attached to the insulation case 60 by inserting the connection parts 32 and 42 into each of the openings 68 formed on both sides of the insulation case 60 in the X-axis direction.

After or before the first metal terminal 30 and the second metal terminal 40 are attached to the insulation case 60, the capacitor chips 20a and 20b are put in order into the housing part 62a via the opening part 620a, and the capacitor chips 20c and 20d are put in order into the housing part 62b via the opening part 620b.

After that, the lid 70 with the terminal connection body 50 attached on the rear surface 70b by adhesion or so is prepared and is attached and fixed on the step 66 of the insulation case 60 so as to cover the opening parts 620a and 620b of the housing parts 62a and 62b. Incidentally, the lid 70 may be fixed on the top part 60e of the insulation case 60 by an engagement member not shown (e.g., claw-like member).

At this time, the capacitor chips 20a and 20b and the capacitor chips 20b and 20d housed in the housing parts 62a and 62b are pressed downward in the Z-axis direction by the lid 70, and the second terminal electrodes 24 of the capacitor chips 20b and 20d arranged on the lower stage in the housing parts 62a and 62b can thereby be connected under pressure with the connection parts 32 and 42 of the metal terminals 30 and 40.

In the capacitor assembly 10 according to the present embodiment, the four capacitor chips 20a to 20d are arranged so that the end surfaces 21 and 23 face the mount surface. Thus, compared to when the four capacitor chips 20a to 20d are arranged so that the end surfaces 21 and 23 are perpendicular to the mount surface (see Patent Document 1), an occupation area of the capacitor assembly 10 on the circuit board is reduced, the capacitor assembly 10 can be mounted on the circuit board with a saved space, and a high-density mounting of the capacitor assembly 10 can be achieved.

Since the capacitor assembly 10 includes the metal terminals 30 and 40 and the terminal connection body 50, the four capacitor chips 20a to 20d can easily be connected in series via the metal terminals 30 and 40 and the terminal connection body 50. The series connection of the four capacitor chips 20a to 20d can increase the withstand voltage of the capacitor assembly 10 and contribute to the improvement in safety of electronic equipment on which the capacitor assembly 10 is mounted.

Moreover, since the bottom part 60f of the insulation case 60 is disposed between the connection parts 32 and 42 and the mount parts 34 and 44 as shown in FIG. 2A, the capacitor chips 20a to 20d arranged above the connection parts 32 and 42 are stably supported on the bottom part 60f, an excessive load is prevented from acting to the connection parts 32 and 42, and the shapes of the metal terminals 30 and 40 (particularly, the connection parts 32 and 42) can be maintained.

In the capacitor assembly 10 according to the present embodiment, the metal terminals 30 and 40 and the second terminal electrodes 24 of the capacitor chips 20b and 20d can be connected without solder. In mounting the capacitor assembly 10, the solder of the connection parts between the metal terminals 30 and 40 and the capacitor chips 20b and 20d is not thereby melted by heat transmitted from the mount parts 34 and 44.

Moreover, the capacitor chips 20a to 20d can effectively be protected from impacts or so by attaching the lid 70 to the insulation case 60. Due to the attachment of the lid 70 to the insulation case 60, the capacitor chips 20a and 20b and the capacitor chips 20c and 20d housed in the housing parts 62a and 62b are pressed by the lid 70 against the bottom part 60f of the insulation case 60, and the second terminal electrodes 24 of the capacitor chips 20b and 20d can be connected under pressure with the connection parts 32 and 42 of the metal terminals 30 and 40. Thus, the metal terminals 30 and 40 and the second terminal electrodes 24 can be connected reliably.

Since the lid 70 includes the terminal connection body 50, the first terminal electrodes 22 of the capacitor chips 20a and 20c arranged next to each other in a parallel direction to the end surfaces 21 and 23 are connected by the terminal connection body 50 in the attachment of the lid 70 to the insulation case 60. Thus, the capacitor chips 20a and 20c arranged next to each other in a parallel direction to the end surfaces 21 and 23 can be connected in series via the terminal connection body 50 only by attaching the lid 70 to the insulation case 60, and the capacitor assembly 10 with simple structure can be obtained.

Second Embodiment

Figure 3:
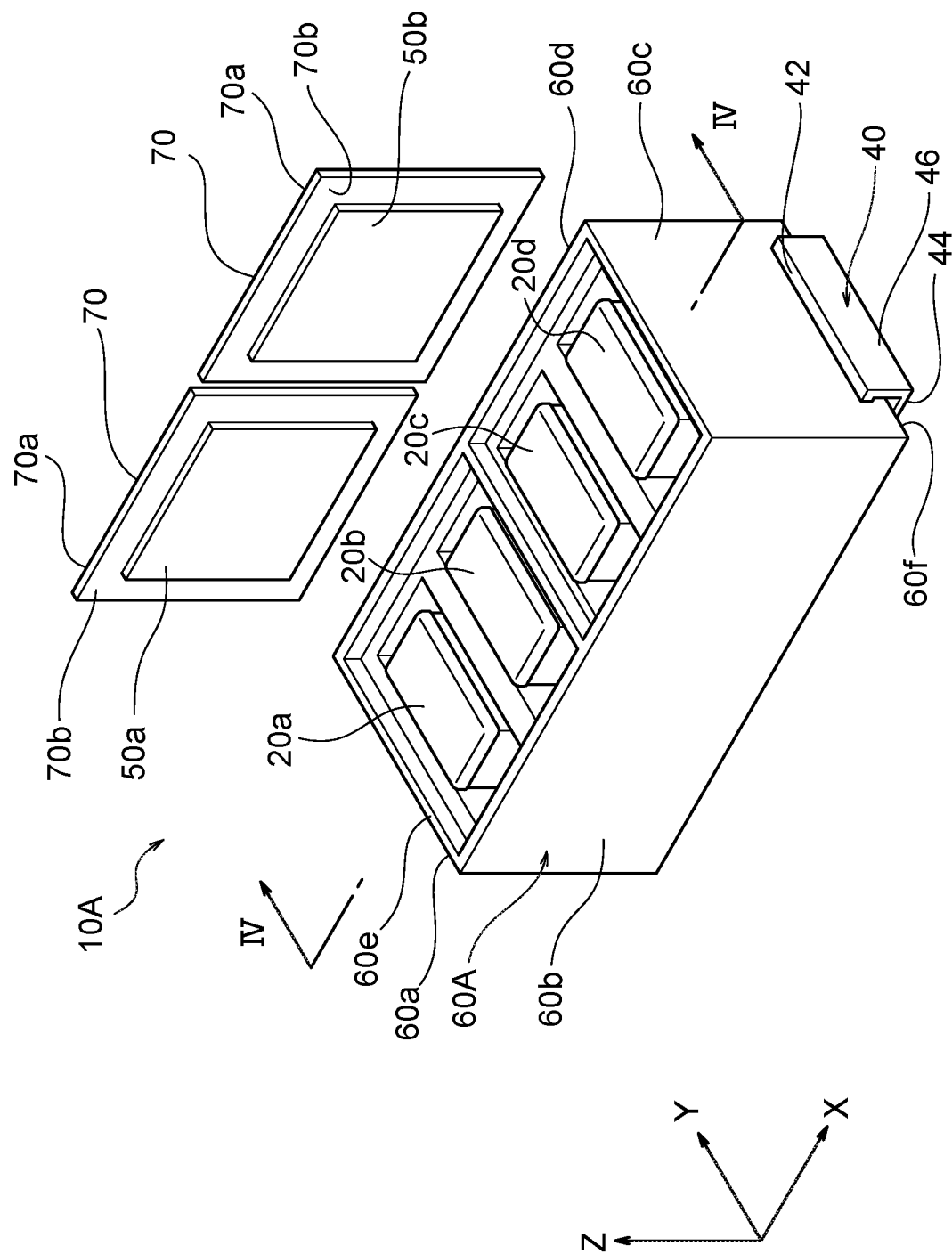
FIG. 3 is a schematic perspective view illustrating a capacitor assembly according to Second Embodiment of the present invention.
Figure 4:
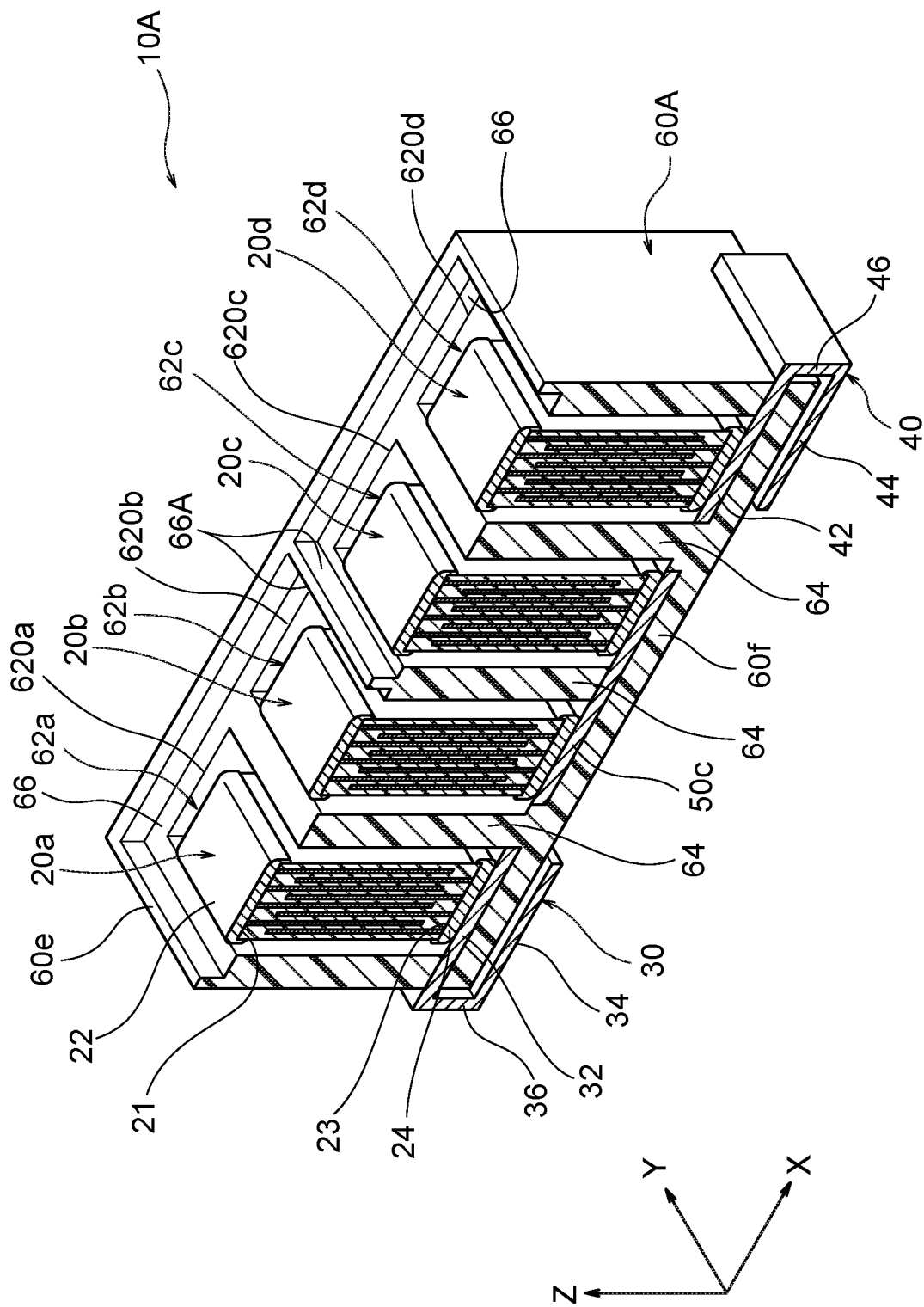
FIG. 4 is a cross-sectional perspective view of the capacitor assembly along the IV-IV line shown in FIG. 3.

Except for the following matters, a capacitor assembly 10A according to Second Embodiment shown in FIG. 3 and FIG. 4 has configurations similar to those of the capacitor assembly 10 according to First Embodiment. In the capacitor assembly 10A shown in FIG. 3 and FIG. 4, the same members as the capacitor assembly 10 shown in FIG. 1 and FIG. 2A are provided with the same references and are not explained.

As shown in FIG. 3 and FIG. 4, the capacitor assembly 10A is different from the capacitor assembly 10 according to First Embodiment in that the capacitor assembly 10A includes an insulation case 60A, two lids 70, and three terminal connection bodies 50a to 50c.

The insulation case 60A is different from the insulation case 60 according to First Embodiment in the following matters. That is, the width of the insulation case 60A in the X-axis direction is larger (approximately double) than the width of the insulation case 60 in the X-axis direction, and the width of the insulation case 60A in the Z-axis direction is smaller (approximately half) than the width of insulation case 60 in the Z-axis direction. In addition to the housing parts 62a and 62b, the insulation case 60A includes housing parts 62c and 62d. The depth in the Z-axis direction of each of the housing parts 62a to 62d of the present embodiment corresponds to the width in the Z-axis direction of the insulation case 60A and is smaller (approximately half) than the depth in the Z-axis direction of the housing part 62a (62b) of First Embodiment.

The capacitor chips 20a to 20d are housed in the housing parts 62a to 62d, respectively. The four housing parts 62a to 62d are divided by the partition parts 64 (partition members). The partition parts 64 are respectively arranged between the capacitor chip 20a and the capacitor chip 20b, between the capacitor chip 20b and the capacitor chip 20c, and between the capacitor chip 20c and the capacitor chip 20d arranged next to each other in the X-axis direction (in a parallel direction to the end surfaces 21 and 23).

As shown in FIG. 4, steps 66A are formed inside the upper end of the partition part 64 disposed between the capacitor chip 20b and the capacitor chip 20c (the side where the housing parts 62a and 62b are arranged and the side where the housing parts 62c and 62d are arranged). Each of the steps 66A connects the central parts in the X-axis direction of the lateral parts 60b and 60d of the insulation case 60A shown in FIG. 3.

The capacitor assembly 10A is formed in a line-symmetrical manner relative to the steps 66A (symmetry axis) when viewed from the top part 60e of the insulation case 60. A step having a square outline formed by connecting the step 66 and the step 66A on one side of the symmetry axis in the X-axis direction corresponds to the outline (square) of either of the lids 70, and this lid 70 can be attached on one side of the insulation case 60A in the X-axis direction by being engaged with this step. Likewise, a step having a square outline formed by connecting the step 66 and the step 66A on the other side of the symmetry axis in the X-axis direction corresponds to the outline (square) of the other lid 70, and this lid 70 can be attached on the other side of the insulation case 60A in the X-axis direction by being engaged with this step.

The terminal connection bodies 50a and 50b are attached to the two lids 70, respectively. As shown in FIG. 4, the terminal connection body 50c is attached above the bottom part 60f of the insulation case 60A, where the housing parts 62b and 62c are positioned. The terminal connection body 50c goes through in the X-axis direction below the partition part 64 positioned between the housing part 62b and the housing part 62c and is attached on the bottom part 60f of the insulation case 60A.

The terminal connection bodies 50a to 50c connect the terminal electrodes on one side of the capacitor chips 20a and 20b, the capacitor chips 20b and 20c, and the capacitor chips 20c and 20d arranged next to each other in the X-axis direction (in a parallel direction to the end surfaces 21 and 23).

In the present embodiment, as shown in FIG. 3 and FIG. 4, the terminal connection body 50a connects the first terminal electrode 22 of the capacitor chip 20a housed in the housing part 62a and the first terminal electrode 22 of the capacitor chip 20b housed in the housing part 62b, the terminal connection body 50b connects the first terminal electrode 22 of the capacitor chip 20c housed in the housing part 62c and the first terminal electrode 22 of the capacitor chip 20d housed in the housing part 62d, and the terminal connection body 50c connects the second terminal electrode 24 of the capacitor chip 20b housed in the housing part 62b and the second terminal electrode 24 of the capacitor chip 20c housed in the housing part 62c.

When either of the lids 70 is attached to the insulation case 60A, the first terminal electrodes 22 of the capacitor chips 20a and 20b arranged next to each other in the X-axis direction are mutually connected (communicated) by the terminal connection body 50a. When the other lid 70 is attached to the insulation case 60A, the first terminal electrodes 22 of the capacitor chips 20c and 20d arranged next to each other in the X-axis direction are mutually connected (communicated) by the terminal connection body 50b. When the capacitor chips 20b and 20c are housed in the housing parts 62b and 62c, the second terminal electrodes 24 of the capacitor chips 20b and 20c arranged next to each other in the X-axis direction are mutually connected (communicated) by the terminal connection body 50c.

Among the four capacitor chips 20a to 20d connected in series via the three terminal connection bodies 50a to 50c, the connection parts 32 and 42 are connected with the terminal electrodes of the capacitor chips located on both ends.

In the present embodiment, the capacitor chips 20a and 20b housed in the housing parts 62a and 62b are connected in series, the capacitor chips 20b and 20c housed in the housing parts 62b and 62c are connected in series, the capacitor chips 20c and 20d housed in the housing parts 62c and 62d are connected in series, and the four capacitor chips 20a to 20d are connected in series. In this case, the capacitor chips 20a and 20d arranged in the housing parts 62a and 62d correspond to the capacitor chips located on both ends of the four capacitor chips 20a to 20d, and the second terminal electrodes 24 of these capacitor chips are electrically connected with the connection parts 32 and 42.

In the present embodiment, effects equal to those of First Embodiment are obtained. In addition, the present embodiment can reduce the height of the capacitor assembly 10A in the Z-axis direction and achieve the low profile, compared to First Embodiment.

Third Embodiment

Figure 5:
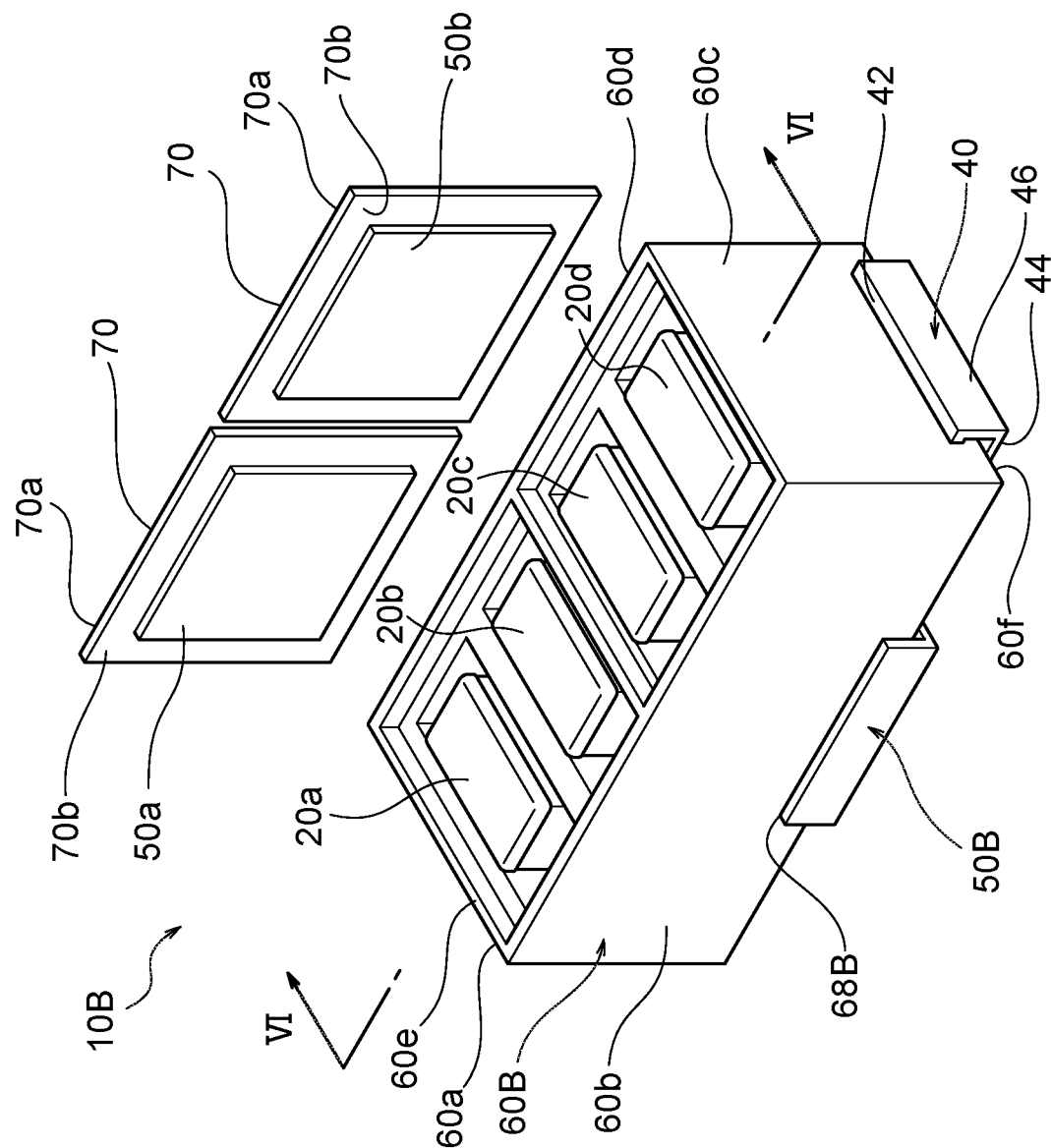
FIG. 5 is a schematic perspective view illustrating a capacitor assembly according to Third Embodiment of the present invention.
Figure 6:
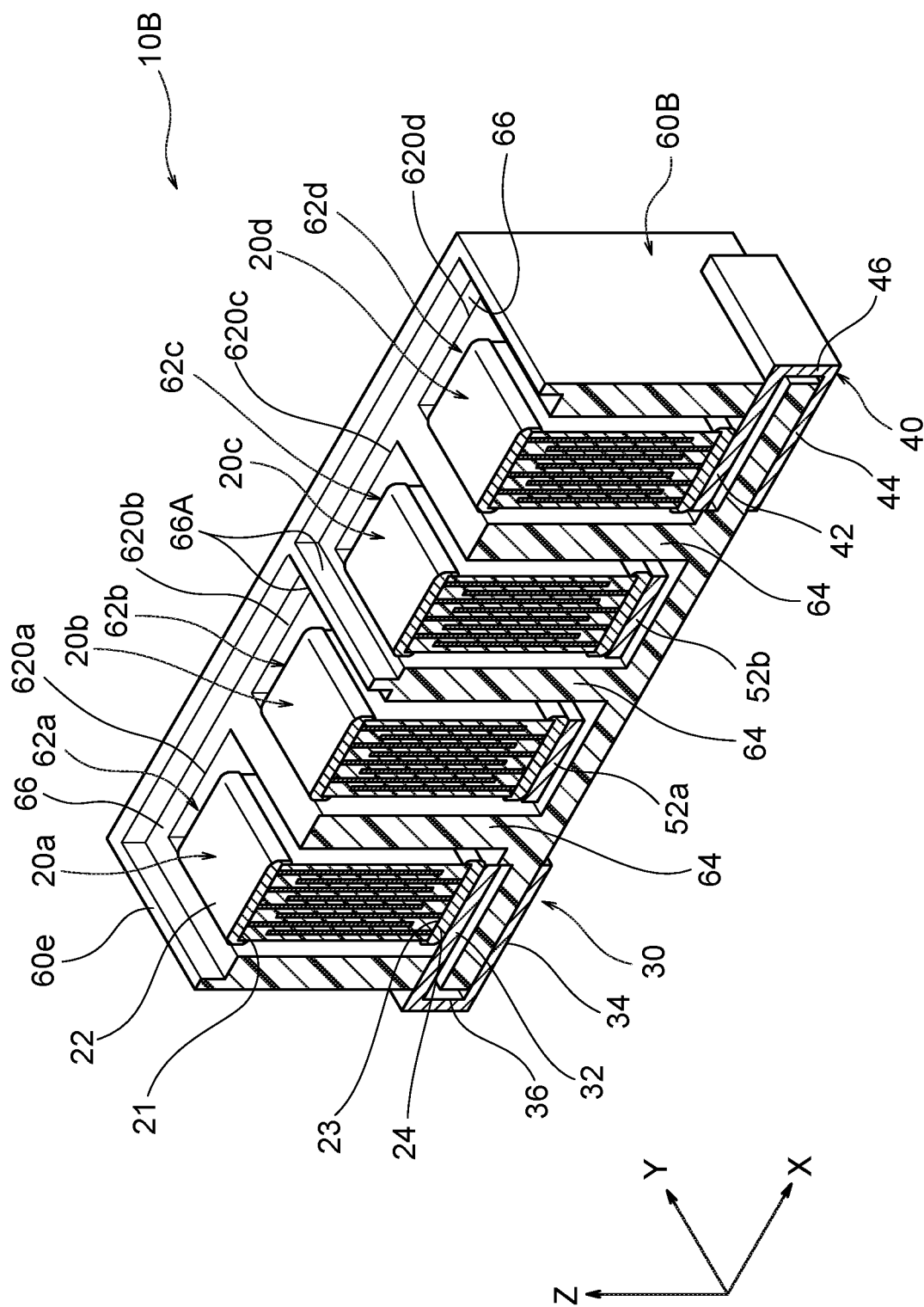
FIG. 6 is a cross-sectional perspective view of the capacitor assembly along the VI-VI line shown in FIG. 5.
Figure 7:
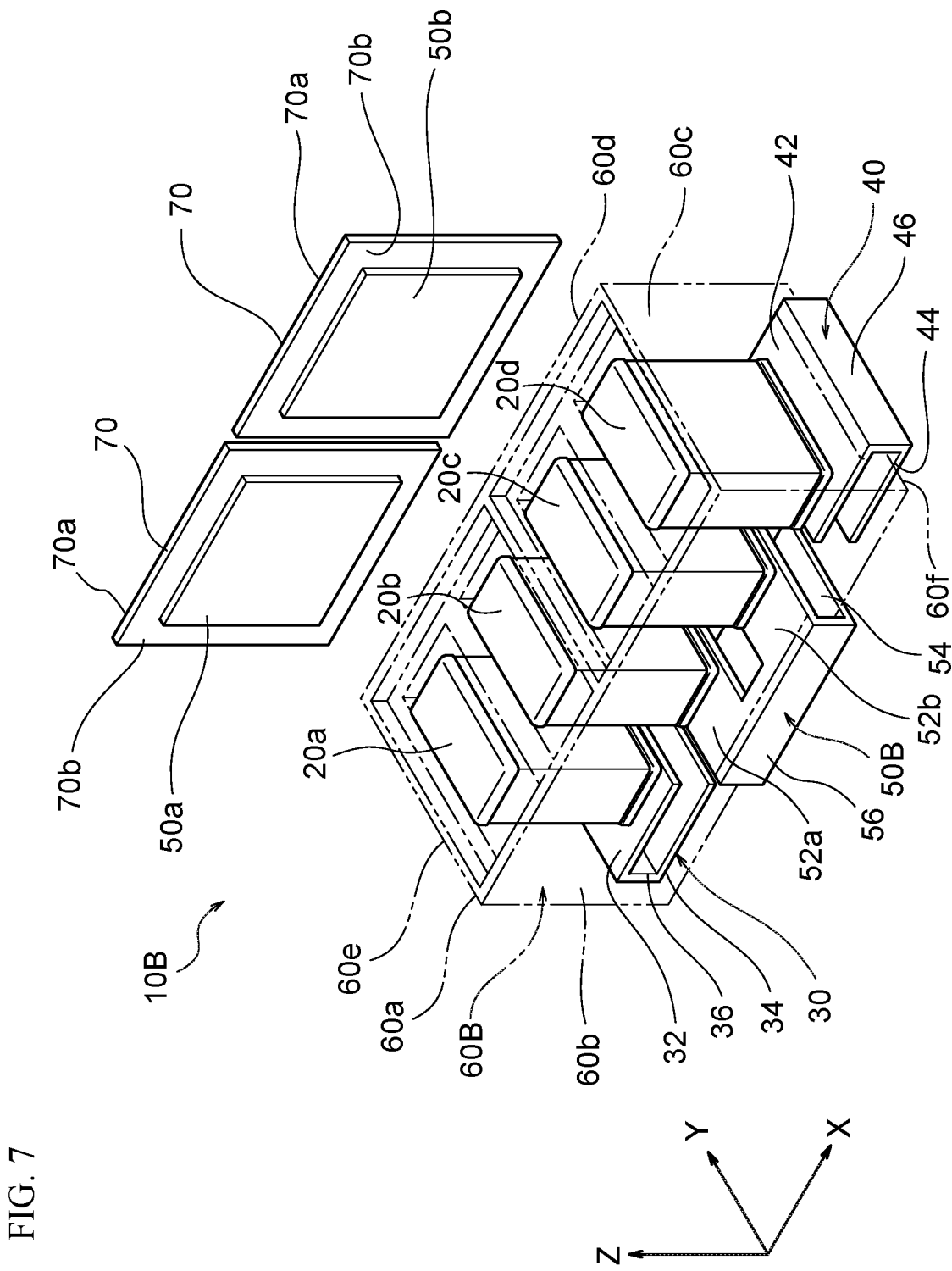
FIG. 7 is a partially transparent perspective view of the capacitor assembly shown in FIG. 5.

Except for the following matters, a capacitor assembly 10B according to Third Embodiment shown in FIG. 5 to FIG. 7 has configurations similar to those of the capacitor assembly 10A according to Second Embodiment. In the capacitor assembly 10B shown in FIG. 5 to FIG. 7, the same members as the capacitor assembly 10A shown in FIG. 3 and FIG. 4 are provided with the same references and are not explained.

As shown in FIG. 7, the capacitor assembly 10B is different from the capacitor assembly 10A according to Second Embodiment in that the capacitor assembly 10B includes a terminal connection body 50B instead of the terminal connection body 50c shown in FIG. 4 and includes an insulation case 60B instead of the insulation case 60A. The terminal connection body 50B includes first and second connection parts 52a and 52b, a mount part 54, and a link part 56, and these are formed integrally.

The terminal connection body 50B connects the terminal electrodes on one side of the capacitor chips 20b and 20c arranged next to each other in the X-axis direction (a parallel direction to the end surfaces 21 and 23). In the present embodiment, the connection part 52a is connected with the second terminal electrode 24 of the capacitor chip 20b housed in the housing part 62b, and the connection part 52b is connected with the second terminal electrode 24 of the capacitor chip 20c housed in the housing part 62c. That is, the terminal connection body 50B connects the second terminal electrodes 24 of the capacitor chips 20b and 20c.

The connection parts 52a and 52b extend inside the insulation case 60B and go through the lateral part 60b in the Y-axis direction via the opening 68B as shown in FIG. 5. The width in the X-axis direction of the connection part 52a (52b) is substantially equal to the width in the X-axis direction of the terminal electrode 22 (24) of each of the capacitor chips 20a to 20d. Although not illustrated in detail, the width in the Y-axis direction of the terminal electrode 22 (24) of each of the capacitor chips 20a to 20d is substantially equal to the width in the Y-axis direction of the terminal electrode 22 (24) of each of the capacitor chips 20a to 20d. In this structure, the entire surface of the second terminal electrode 24 of the capacitor chip 20b (20c) can be connected with the connection part 52a (52b).

The mount part 54 faces the connection parts 52a and 52b and a mount board and is connected with the mount board. The lower surface of the mount part 54 corresponds to the mount surface. The mount part 54 is located outside the insulation case 60B and extends below the bottom part 60f in the Y-axis direction along the bottom part 60f of the insulation case 60. Incidentally, the extending direction of the mount part 54 is the same as that of the connection part 52a (52b).

The link part 56 links the connection parts 52a and 52b and the mount part 54. The link part 56 extends substantially perpendicularly to the connection parts 52a and 52b and the mount part 54. The length of the link part 56 in the Z-axis direction is configured to be slightly larger than the thickness of the bottom part 60f of the insulation case 60B in the Z-axis direction.

In the present embodiment, the bottom part 60f of the insulation case 60B is disposed (sandwiched) between the connection parts 52a and 52b and the mount part 54. A predetermined space is formed between the bottom part 60f of the insulation case 60B and the connection parts 52a and 52b.

In the present embodiment, the above-mentioned predetermined space is also formed between the bottom part 60f of the insulation case 60B and the connection parts 32 and 42 of the metal terminals 30 and 40.

In this case, when the connection parts 32, 52a, 52b, and 42 are pressed by the capacitor chips 20a to 20d housed in the housing parts 62a to 62d, the connection parts 32, 52a, 52b, and 42 are bent (deformed) downward in the Z-axis direction. Thus, the width in the Z-axis direction of the housing space of each of the housing parts 62a to 62d can be variable by the bent amount, and the errors of size or so of the capacitor chips 20a to 20d can be absorbed. Moreover, due to the spring force (elasticity), the connection parts 32, 52a, 52b, and 42 can effectively be connected under pressure with the second terminal electrodes 24 of the capacitor chips 20a to 20d.

In such a pressure connection state, when the second terminal electrodes 24 of the capacitor chips 20a to 20d housed in the housing parts 62a to 62d are connected under pressure with the connection parts 32, 52a, 52b, and 42, even if a load acting downward in the Z-axis direction applies to the connection parts 32, 52a, 52b, and 42, the connection parts 32, 52a, 52b, and 42 can be supported on the bottom part 60f of the insulation case 60B, and the shapes of the connection parts 32, 52a, 52b, and 42 can be maintained.

In the present embodiment, effects equal to those of Second Embodiment are obtained. In the present embodiment, the terminal connection body 50B is also connected on the mount board in addition to the metal terminals 30 and 40, and the capacitor assembly 10B can stably be supported via the metal terminals 30 and 40 and the terminal connection body 50B.

Incidentally, the present invention is not limited to the above-mentioned embodiments and may variously be changed within the scope of the present invention.

(1) In the above-mentioned embodiments, for example, the capacitor chips are used as an example of the chip components, but the chip components may be any other components.

(2) In the above-mentioned embodiments, the number of capacitor chips owned by the capacitor assembly 10 (10A, 10B) is not limited to four and may be any plural number (preferably, even number). For example, the size of the insulation case 60 (housing parts 62a and 62b) shown in FIG. 2A is appropriately adjusted, and the capacitor assembly 10 may be provided with only two capacitor chips 20a and 20b.

(3) In the above-mentioned embodiments, the bottom part 60f of the insulation case 60 (60A, 60B) functions as a support member (holding member), but another support member (holding member) may be separately prepared and disposed at a position corresponding to the bottom part 60f of the insulation case 60 (60A, 60B). That is, the support member (holding member) with insulation disposed between the connection part and the mount part may be formed separately from the insulation case.

(4) In the above-mentioned embodiments, the partition part 64 forms a part of the insulation case 60 (60A, 60B), but another partition member (a member that functions similarly to the partition part 64) may be prepared and disposed at a position corresponding to the partition part 64 of the insulation case 60 (60A, 60B). That is, the partition part with insulation disposed between the chip components arranged next to each other in a parallel direction to the end surfaces may be formed separately from the insulation case.

(5) In the above-mentioned embodiments, the insulation cases 60, 60A, and 60B are not necessary components, and the capacitor assemblies 10, 10A, and 10B may be provided with at least the support member of (3).

(6) In the above-mentioned embodiments, the lid 70 is not a necessary component, and the terminal connection bodies 50 and 50a to 50c themselves may be used as a lid.

Figure 2B:
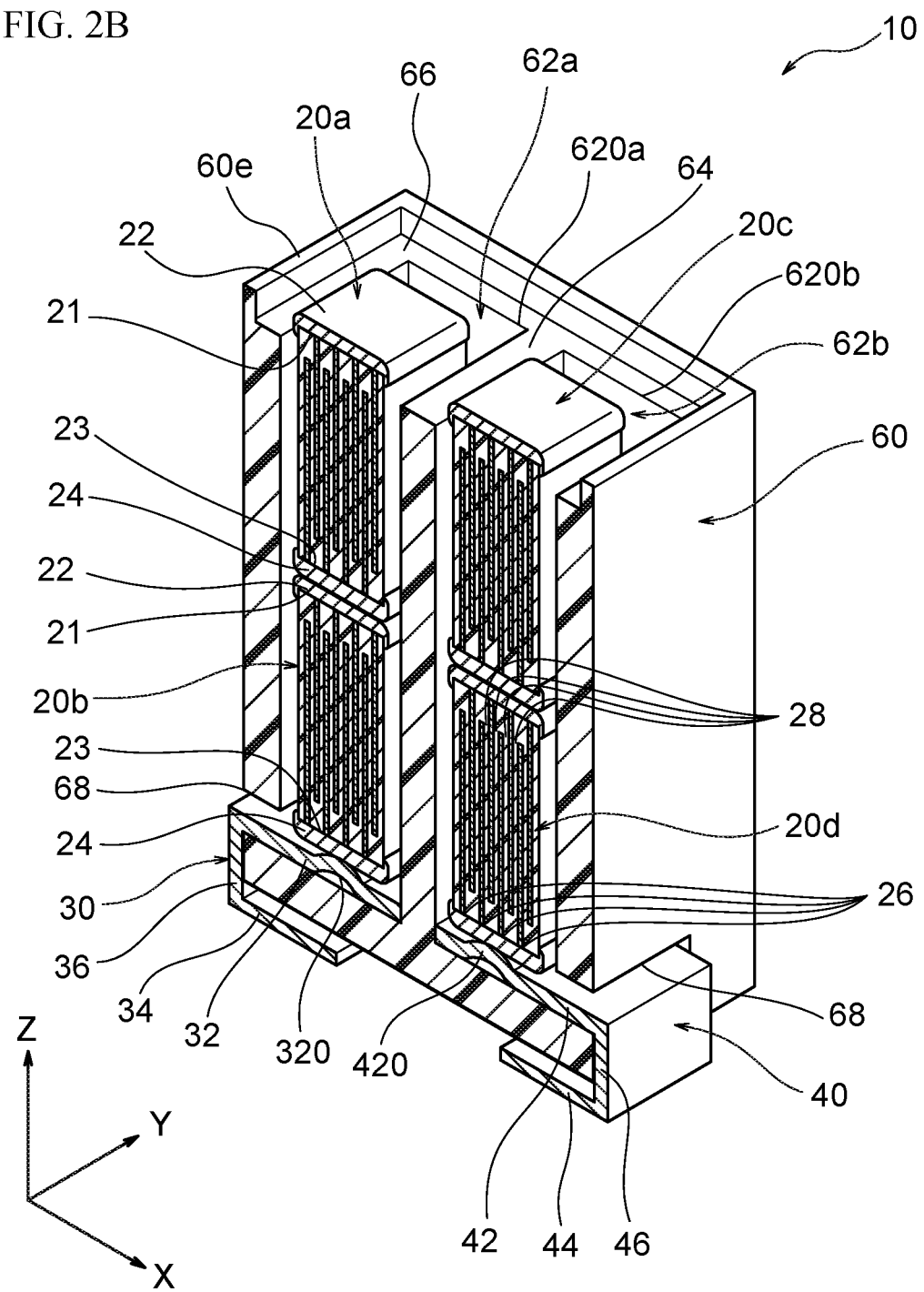
FIG. 2B is a cross-sectional perspective view of a variation of the capacitor assembly shown in FIG. 2A.

(7) In First Embodiment, as shown in FIG. 2B, the metal terminals 30 and 40 may be machined (bent) to locally curve the connection parts 32 and 42, and convex parts (curved parts) 320 and 420 protruding upward in the Z-axis direction may be formed at the connection parts 32 and 42. In this case, the second terminal electrodes 24 of the capacitor chips 20b and 20d arranged on the lower stage in the housing parts 62a and 62b can effectively be connected under pressure with the connection parts 32 and 42 by spring forces generated by the convex parts 320 and 420. Incidentally, the terminal connection body 50 may be connected under pressure with the first terminal electrodes 22 of the capacitor chips 20a and 20c arranged on the upper stage in the housing parts 62a and 62b by a spring force generated from a convex part provided at the terminal connection body 50 and having the above-mentioned function.

(8) In the terminal connection body 50B of Third Embodiment, the connection part may be formed by a substantially square metal plate without separating the connection part 52a and the connection part 52b.

(9) In the above-mentioned embodiments, the number of terminal connection bodies 50 is one or three, but the number of terminal connection bodies 50 may appropriately be changed based on the number of capacitor chips.

(10) In the above-mentioned embodiments, the steps 66 and 66A are not necessary components. In this case (not limited to this case), the width of each of the capacitor chips in the Z-axis direction (or a value obtained by multiplying the width of each of the capacitor chips in the Z-axis direction with the number of laminated capacitor chips) and the width of each of the insulation cases 60 to 60B in the Z-axis direction may be substantially equal to each other.

(11) In the above-mentioned embodiments, the directions of the metal terminals 30 and 40 may appropriately be changed. In FIG. 2B, for example, both of the metal terminals 30 and 40 are arranged so that the connection parts 32 and 42 extend in the X-axis direction, but at least either of the metal terminals 30 and 40 may be disposed so that the connection part 32 (42) extends in the Y-axis direction. In this case, the connection part 32 (42) goes through the lateral part 60b or the lateral part 60d of the insulation case 60 in the Y-axis direction.

DESCRIPTION OF THE REFERENCE NUMERICAL

10 . . . capacitor assembly
20a-20d . . . capacitor chip

21 ... first end surface
22 ... first terminal electrode
23 ... second end surface
24 ... second terminal electrode
26 ... internal electrode layer
28 ... dielectric layer
30 ... first metal terminal
32 ... connection part
320 ... convex part
34 ... mount part
36 ... link part
40 ... second metal terminal
42 ... connection part
420 ... convex part
44 ... mount part
46 ... link part
50, 50a-50c, 50B ... terminal connection body
52a ... first connection part
52b ... second connection part
54 ... mount part
56 ... link part
60, 60A, 60B ... insulation case
60a-60d ... lateral part
60e ... top part
60f ... bottom part (support member)
62a ... first housing part
620a ... opening part
62b ... second housing part
620b ... opening part
64 ... partition part (partition member)
66, 66A ... step
68, 68B ... opening part
70 ... lid

What is claimed is:

1. An electronic device comprising:
a plurality of chip components each having a pair of end surfaces on which terminal electrodes are formed;
a terminal connection body connecting the terminal electrodes on one side of the chip components arranged next to each other in a parallel direction to the end surfaces;
a plurality of conductive terminals each including:
a connection part connected with the terminal electrode of either of the chip components located on both ends of the chip components connected in series via the terminal connection body; and
a mount part facing the connection part and connected with a mount board; and
a support member with insulation disposed between the connection parts and the mount parts; and
an insulation case including a plurality of concave housing parts each having an opening part at one end,
wherein the chip components are arranged so that the end surfaces face the mount board.

2. The electronic device according to claim 1, further comprising a partition member with insulation disposed between the chip components arranged next to each other in a parallel direction to the end surfaces.

3. The electronic device according to claim 1, wherein the support member forms a bottom part of the insulation case, and
the partition member forms a wall surface dividing the housing parts.

4. The electronic device according to claim 1, further comprising a lid configured to be attached to the insulation case so as to cover the opening parts.

5. The electronic device according to claim 3, further comprising a lid configured to be attached to the insulation case so as to cover the opening parts.

6. The electronic device according to claim 4, wherein the lid includes the terminal connection body, and
the terminal electrodes on one side of the chip components arranged next to each other in a parallel direction to the end surfaces are connected by the terminal connection body in the attachment of the lid to the insulation case.

7. The electronic device according to claim 5, wherein the lid includes the terminal connection body, and
the terminal electrodes on one side of the chip components arranged next to each other in a parallel direction to the end surfaces are connected by the terminal connection body in the attachment of the lid to the insulation case.

8. An electronic device comprising:
a plurality of chip components each having a pair of end surfaces on which terminal electrodes are formed;
a terminal connection body connecting the terminal electrodes on one side of the chip components arranged next to each other in a parallel direction to the end surfaces;
a plurality of conductive terminals each including:
a connection part connected with the terminal electrode of either of the chip components located on both ends of the chip components connected in series via the terminal connection body; and
a mount part facing the connection part and connected with a mount board;
a support member with insulation disposed between the connection parts and the mount parts;
an insulation case including a plurality of concave housing parts each having an opening part at one end; and
a lid configured to be attached to the insulation case so as to cover the opening parts,
wherein the chip components are arranged so that the end surfaces face the mount board,
a step is formed on the top part of the insulation case, and
the lid is attached to the insulation case by being engaged with the step.

9. An electronic device comprising:
a plurality of chip components each having a pair of end surfaces on which terminal electrodes are formed;
a terminal connection body connecting the terminal electrodes on one side of the chip components arranged next to each other in a parallel direction to the end surfaces;
a plurality of conductive terminals each including:
a connection part connected with the terminal electrode of either of the chip components located on both ends of the chip components connected in series via the terminal connection body; and
a mount part facing the connection part and connected with a mount board;
a support member with insulation disposed between the connection parts and the mount parts; and
an insulation case including a plurality of concave housing parts each having an opening part at one end,
wherein an upper surface of the support member forms a bottom surface of the concave housing parts, and
the support member supports:
the connection part arranged on the bottom surface of the concave housing parts; and the chip components housed in the concave housing parts via the opening part and having the terminal electrodes connected to the connection part.

10. The electronic device according to claim 1, the side openings are formed at an intersection between the lateral surfaces of the insulation case and the upper surface of the support member.

* * * * *